US006198413B1

United States Patent
Widmer

(10) Patent No.: US 6,198,413 B1
(45) Date of Patent: Mar. 6, 2001

(54) PARTITIONED DC BALANCED (0,6) 16B/18B TRANSMISSION CODE WITH ERROR CORRECTION

(75) Inventor: Albert X. Widmer, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/346,230

(22) Filed: Jul. 1, 1999

(51) Int. Cl.[7] .............................. H03M 5/00; H03M 7/00
(52) U.S. Cl. ................... 341/59; 341/59; 341/58
(58) Field of Search ........................ 341/58, 59

(56) References Cited

U.S. PATENT DOCUMENTS

| | | | |
|---|---|---|---|
| 3,798,635 | * 3/1974 | Candiani | 340/347 DD |
| 4,486,739 | 12/1984 | Franaszek et al. | |
| 5,144,304 | 9/1992 | McMahon et al. | |
| 5,396,239 | * 3/1995 | McMahon et al. | 341/58 |
| 5,740,186 | 4/1998 | Widmer | |
| 5,854,810 | * 12/1998 | Denissen et al. | 375/242 |
| 6,046,691 | * 4/2000 | Aziz et al. | 341/58 |
| 6,081,210 | * 6/2000 | Nikolic et al. | 341/59 |

OTHER PUBLICATIONS

"The ANSI Fibre Channel Transmission Code," IBM RC 18855, 39 pages, Apr. 23, 1993.

* cited by examiner

Primary Examiner—Michael Tokar
Assistant Examiner—Vibol Tan
(74) Attorney, Agent, or Firm—Ryan, Mason & Lewis, LLP; Paul J. Otterstedt

(57) ABSTRACT

A coding system includes methods and apparatus for producing a (0,6) run length limited rate 16B/18B code. The code produced is dc balanced and capable of operating near the theoretical performance limits for a 16B/18B code. This means the code is near optimum for run length and digital sum variation for a 16B/18B code. In one aspect of the invention, each 16-bit input data stream or block is broken into a 9-bit and a 7-bit sub-block and encoded separately while maintaining both dc balance and run length constraints across all block and sub-block boundaries. The present invention also provides a plurality of special purpose control characters such as commas, delimiters, idle characters, etc., by using the extra bits in the coded blocks whereby the special characters may be readily distinguished from data, while at the same time maintaining the dc balance and run length limitations in such characters. The 16B/18B transmission coding system of the invention also provides error correction techniques.

53 Claims, 7 Drawing Sheets

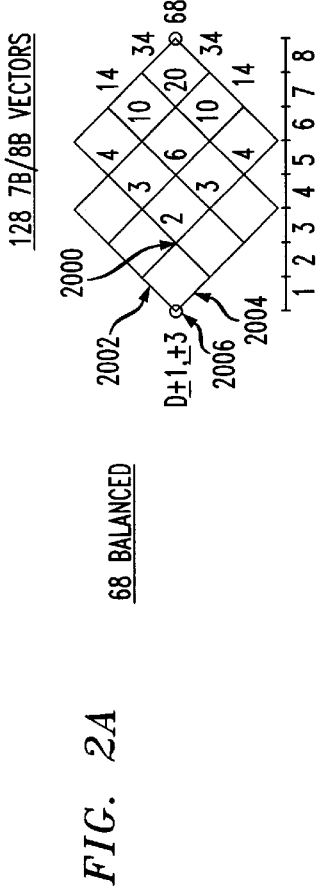
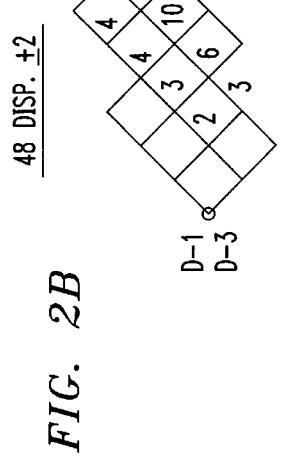
FIG. 2A
FIG. 2B
FIG. 2C

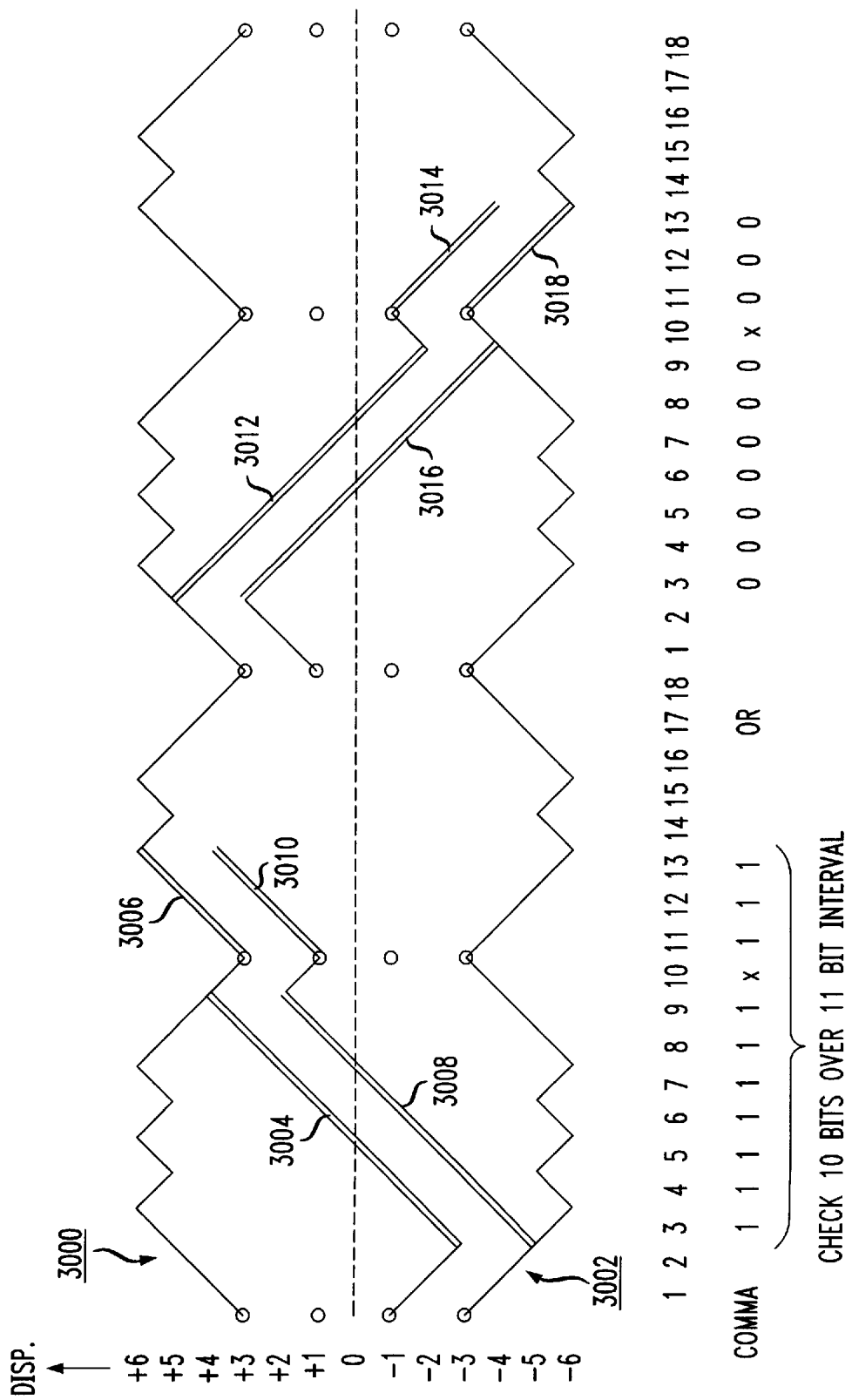

FIG. 9

| TABLE 1: ERROR LOCATING |||||||
|---|---|---|---|---|---|---|
| RD | BYTE NAME | CODED 10B, 8B | BD | BB | QP | HP |
| -1 | 10B_0 | 1110101000 | 0 | 0 | | |
| -1 | 8B_0 | 11100111 | +4 | 0 | | |
| +3 | 10B_1 | 1110000001 | -2 | 1 | | |
| +1 | 8B_1 | 10000010 | -4 | 0 | 1 | |
| -3 | 10B_2 | 0111111000 | +2 | 1 | | |
| -1 | 8B_2 | 11001110 | +2 | 1 | | |
| +1 | 10B_3 | 1100101001 | 0 | 0 | | |
| +1 | 8B_3 | 01000100 | -4 | 0 | 0 | |
| -1 | 10B_4 | xxxxxxxxxx | +2 | 1 | | |
| +1 | 8B_4 | xxxxxxxx | 0 | 0 | | |
| +1 | 10B_5 | xxxxxxxxxx | -4 | 0 | | |
| -3 | 8B_5 | xxxxxxxx | 0 | 0 | 1 | |
| -3 | 10B_6 | xxxxxxxxxx | 0 | 0 | | |
| -3 | 8B_6 | xxxxxxxx | +2 | 1 | | |
| -1 | 10B_7 | xxxxxxxxxx | 0 | 0 | | |
| -1 | 8B_7 | xxxxxxxx | +2 | 1 | 0 | 0 |
| | | | | | | |
| | 8B_15 | | | x | x | x |
| | | | | | | |
| | 8B_23 | | | x | x | x |
| | | | | | | |
| | 8B_31 | | | x | x | x |
| | h PARITY | | | h h h | h h h h | h h h |

PARTITIONED DC BALANCED (0,6) 16B/18B TRANSMISSION CODE WITH ERROR CORRECTION

FIELD OF THE INVENTION

The present invention relates generally to transmission codes and, more particularly, to methods and apparatus for producing a partitioned dc balanced (0,6) 16B/18B transmission code with error correction from an input data stream.

BACKGROUND OF THE INVENTION

The primary purpose of transmission codes is to transform the frequency spectrum of a serial data stream so that clocking can be recovered readily and ac (alternating current) coupling is possible. The code must also provide special characters outside the data alphabet for functions such as character synchronization, frame delimiters and perhaps for abort, reset, idle, diagnostics, etc. Codes are also used, often in combination with signal waveform shaping, to adapt the signal spectrum more closely to specific channel requirements. In most cases a reduction in bandwidth by constraints on both the high and the low frequency components is desirable to reduce distortion in the transmission media, especially electromagnetic cables, or in the band limited receiver, and to reduce the effects of extrinsic and intrinsic noise.

Another aspect of codes is their interaction with noise and errors in the line digits. The redundancy associated with line codes can be used to supplement other error detection mechanisms or to monitor the quality of the channel with a minimal amount of circuitry.

Such codes generally exhibit the undesirable feature of enlarging error bursts in the decoded data, making detection by a cyclic redundancy check more difficult. A good transmission code should minimize these effects.

For fiber optic links and intra-establishment wire links, interest centers for many reasons on the family of two-level codes. For wire links one prefers codes with no dc (direct current) and little low frequency content in order to dc isolate the transmission line from the driver and receiver circuitry, usually by transformers, and to reduce signal distortion on the line. Although these factors do not apply to the fiber optic case, good low frequency characteristics of the code are helpful for a number of reasons.

The high gain fiber optic receivers need an ac coupling stage near the front end. The control of the drive level, receiver gain, and equalization is simplified and the precision of control is improved, if it can be based on the average signal power, especially at top rates. DC restore circuits tend to lose precision with rising data rates and cease to operate properly below the maximum rates for other circuits required in a transceiver. Finally, if the time constants associated with the parasitic capacitances at the front end of a receiver are comparable to or longer than a baud interval, a signal with reduced low frequency content will suffer less distortion and will enable many links to operate without an equalizing circuit.

The Manchester and related codes are simple two-level codes and solve the clocking and low frequency problems very well. They translate each bit into two bits for transmission and are a good choice whenever the high clocking rates cause no problems in the logic or analog circuits, the transducers or on the transmission line. They also reduce the data transmission rate by a factor of two since they encode 2 bits for every data bit (i.e., rate ½).

Simple 5B/6B codes translate 5 binary bits into 6 binary digits and raise the number of information bits transmitted per baud interval to 0.833. Unfortunately, the implementation of a 5B/6B code in a byte-oriented (8 bit) system causes burdensome complexities. If the encoding and decoding is done serially, most of the circuits needed have to operate at the baud rate, which sometimes is at the technology limits. Also, there is no simple relationship between the byte clock and the coder clock. Finally, if the frames are not multiples of 5 bytes, the character boundaries will not align with the frame boundaries, which is unattractive, whether corrected or not. If the coding and decoding is done in parallel, there is no simple mechanism to align a byte parallel interface with a 5B/6B coder; the most straightforward way requires shift registers operating at the baud rate.

An article by T. Horiguchi and K. Morita, "An Optimization of Modulation Codes in Digital Recording," IEEE Transactions on Magnetics, Vol. MAG-12, No. 6, November 1976, page 740, is in essence a survey article which cites a great many possible formats for run length limited codes having various d, k values and varying coding rates. It is cited for reference purposes, it being noted that there are no codes suggested in this article having parameters even remotely approaching those of the presently disclosed coding system. Similarly the article is not concerned with maintaining dc balance in the resulting code stream.

An article entitled "Encoding/Decoding for Magnetic Record Storage Apparatus," by R. C. Kiwimagi, IBM Technical Disclosure Bulletin, Vol. 18, No. 10, March 1976, page 3147, discloses a (0,6) rate 4/5 run length limited code which attempts to maintain a dc balance. It is noted that this code is significantly different from the present coding system in that both the codes produced and the coder configuration are quite different than that of the present invention.

U.S. Pat. No. 3,798,635 to Candiani, entitled "Channel Monitor for Depressed-Code PCM Transmission System," discloses an 8-bit to 12-bit code expansion system. It does not disclose the present system's dc balanced run length limited codes.

U.S. Pat. No. 3,577,142 to McMillin, entitled "Code Translation System," discloses a system for translating a 12-bit code into a 8-bit code and is cited as background but does not relate to the present run length limited coding systems.

U.S. Pat. No. 3,594,560 to Stanley, entitled "Digital Expander Circuit," discloses a simple expander for precompressed data and not otherwise related to run length limited coding systems.

U.S. Pat. No. 4,486,739 to Franaszek et al., entitled "Byte Oriented DC Balanced (0,4) 8B/10 B Partitioned Block Transmission Code," the disclosure of which is incorporated herein by reference, discloses a dc balanced code that translates an 8-bit byte of information into 10 binary digits for transmission.

A research report entitled "The ANSI Fibre Channel Transmission Code," IBM RC 18855, Apr. 23, 1993, the disclosure of which is incorporated herein by reference, discloses an 8B/10B transmission code for use in accordance with the Fibre Channel Standard (FCS) developed under the auspices of the American National Standards Institute (ANSI).

U.S. Pat. No. 5,740,186 to Widmer, entitled "Apparatus and Method for Error Correction Based on Transmission Code Violations and Parity," the disclosure of which is incorporated herein by reference, discloses techniques for correcting errors in binary transmission coded data.

U.S. Pat. No. 5,144,304 to McMahon et al., entitled "Data and Forward Error Control Coding Techniques for Digital Signals," discloses a 16B/20B code using balanced vectors in a 8B/9B and 10B/11B sub-encoding scheme.

An article entitled "Binary Codes Suitable for Line Transmission," Electronics Letters, Vol. 5, No. 4, pp. 79–81, Feb. 20, 1969, generally describes dc balanced rate 5/6 and 3/4 codes but does not suggest combining same nor does it show similar embodiment circuitry.

No prior art is known to the inventor, which partitions an 16-bit input block into 9-bit and 7-bit sub-blocks for encoding purposes nor discloses coding apparatus for concurrently doing the logic manipulations for computing the proper code words, the disparity of said code words and, depending upon the disparity of the preceding sub-block, concurrently determining whether a given code word or its complement will be coded.

SUMMARY OF THE INVENTION

The present invention provides a coding system which includes methods and apparatus for producing a (0,6) run length limited rate 16B/18B code. The code produced is dc balanced and capable of operating near the theoretical performance limits for a 16B/18B code. This means the code is near optimum for run length and digital sum variation for a 16B/18B code. In one aspect of the invention, each 16-bit input data stream or block is broken into a 9-bit and a 7-bit sub-block and encoded separately while maintaining both dc balance and run length constraints across all block and sub-block boundaries. The invention provides a coding system wherein the coding hardware performs bit encoding, disparity, and complementation determinations in parallel to minimize encoding time and logic levels. Such logic, disparity, and complementation determinations may be logically combined with the uncoded data bits to provide a coded sub-block in a minimum number of logic levels.

The present invention also provides a plurality of special purpose control characters such as commas, delimiters, idle characters, etc. by using the extra bits in the coded blocks whereby the special characters may be readily distinguished from data, while at the same time maintaining the dc balance and run length limitations in such characters.

The objects, features and advantages of the present invention are realized by utilizing a (0,6) run length limited rate 16B/18B code. The coding system set forth herein, as embodied in the disclosed methods and apparatus, substantially alleviates the problem of coder/decoder complexity by partitioning the 16-bit blocks to be encoded into sub-blocks, specifically 9B/10B and 7B/8B blocks. Coders for these blocks interact logically to provide a 16B/18B code with advantageous ac coupling characteristics and timing properties.

In another aspect of the present invention, advantageous error correction techniques are provided in accordance with the (0,6) run length limited rate 16B/18B code.

These and other objects, features and advantages of the present invention will become apparent from the following detailed description of illustrative embodiments thereof, which is to be read in correction with the accompanying drawings.

BRIEF DESCRIPTION OF THE DRAWINGS

FIGS. 2A through 2C are respective trellis diagrams illustrating the 7B/8B code portion of a 16B/18B transmission code according to the invention;

FIG. 3 is a trellis envelope diagram illustrating characteristics of a 16B/18B transmission code and exemplary configurations for a comma character sequence according to the invention;

FIG. 9 is a tabular diagram illustrating error location used in a transmission code error correction method according to the invention.

DETAILED DESCRIPTION OF PREFERRED EMBODIMENTS

Figure 1A:
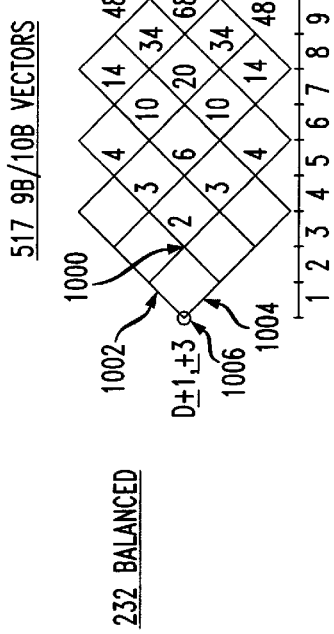
FIGS. 1A through 1C are respective trellis diagrams illustrating the 9B/10B code portion of a 16B/18B transmission code according to the invention.

A partitioned dc balanced (0,6) 16B/18B transmission code according to the invention will be described below in the context of an illustrative coding system. The coding system includes an encoder and a corresponding decoder in communication with one another via a transmission channel. The transmission channel may be a fiber optic link, a wire link (e.g., coaxial cable, shielded twisted pair cables, etc.), or some other appropriate link. However, it is to be appreciated that the transmission code of the invention is not limited to any particular coding system architecture but rather may be implemented in a coding system in which it may be desirable provide a partitioned dc balanced 16B/18B transmission code capable of operating near the its theoretical performance limits, i.e., the code being near optimum for run length and digital sum variation for a 16B/18B code.

For ease of reference the detailed description is divided into the following sections: (I) Coding Concepts and Definitions; (II) Description of the Partitioned DC Balanced (0,6) 16B/18B Transmission Code. Section II is itself subdivided as follows: (A) 9B/10B Code; (B) 7B/8B Code; (C) Properties of the 16B/18B Code; (D) Implementation of Encoder and Decoder; and (E) Error Correction.

I. Coding Concepts and Definitions

As used herein, the following terms are defined in the following manner. A "vector" is a particular bit pattern of defined length. A "source vector" is the uncoded data or control character from an information source. A "coded vector" is the bit pattern resulting from coding. The "run length" (RL) is the maximum number of contiguous one or zero bits, either inside bytes or across byte boundaries, as seen on the transmission media, i.e., after an NRZI operation, if applicable. As is known, NRZI stands for Non Return to Zero Invert on ones, i.e., a technique where a polarity or level transition represents a one, and the absence of a transition represents a zero. A "code point" is an uncoded source vector together with the associated single vector or pair of vectors in the coded domain. The "disparity" of a vector, or the block disparity (DB), is the difference between the number of one and zero bits in a defined block of bits. The "running disparity" (RD) takes on a new value after every transmitted bit. It is incremented by one for a one bit and decremented by one for a zero bit. For balanced codes, it is usually referenced to a steady state average value of zero. The "digital sum variation" (DSV) is the difference between the maximum and minimum value of the running disparity between two points in the bit stream (not just between byte boundaries). For a balanced code, the DSV is finite over an arbitrarily long string of bits. The "normalized dc offset" of a block of bits is closely related to the low frequency spectrum content that the bit pattern can generate. It is defined as the sum of the RD values after each transmitted bit, divided by the number of bits in the block.

A "comma" indicates the proper byte boundaries and can be used for the instantaneous acquisition or verification of the character and word boundaries. To be useful, a comma must occur with uniform alignment relative to the byte boundaries. In the absence of errors, the comma must not occur in any other bit positions, neither within characters nor through overlap between characters. A "comma character" is a coded byte completely containing a comma. A "special character" is a valid transmission character which does not translated into one of the valid data bytes. Special characters are also referred to as "control characters" because of the way they are used in the coding system.

As noted above, run length is defined as the number of identical contiguous symbols which appear in the signal stream. For a binary code, the run length is the number of contiguous ones or zeros after encoding. What is of interest is the shortest (X) and the longest (Y) run lengths that appear. These two parameters are often given in the form (d,k) where d=X−1 and k=Y−1. The (d,k) representation gives the minimum (d) and maximum (k) number of bauds between unequal symbols. For an (0,6) code, for example, any symbol can be followed by no more than 6 contiguous identical symbols, for a maximum run length of 7. Codes designed for digital transmission usually have a parameter d of zero.

A basic principle embodied in the present invention is the partitioned block format. Due to reasons connected with error propagation, it is desirable to encode 16 bits at a time in code words of 18 bits to be transmitted. To reduce implementation complexity problems, error propagation and other concerns, this is accomplished via the partitioned block format: that is, the 16 bits are encoded using coders producing less than 18-bit outputs. That is, as will be explained, the 16-bit input stream is partitioned into the first 9 bits of the 16-bit block and into the last 7 bits of the 16-bit block. Then, a 9B/10B bit encoder encodes the 9-bit sub-block into a 10-bit coded vector, while a 7B/8B encoder encodes the 7-bit sub-block into an 8-bit coded vector. These coders interact so as to yield the desired code words. The result is a coder whose coding rate, complexity and error propagation are near the theoretical limits, and which has ancillary benefits in flexibility of adaptation to various situations.

II. Description of the Partitioned DC Balanced (0,6) 16B/18B Transmission Code

A partitioned dc balanced 16B/18B transmission code is generated in accordance with the present invention from a 9B/10B code in the leading position (with respect to he input data stream) followed by a concatenated 7B/8B code in the trailing position. At the 18B, 10B and 8B boundaries, the running disparity can assume one of four values: +3, +1, −1, or −3 (RD=±1, or RD=±3). The entire code has a running disparity range from −6 to +6. The maximum run length within the blocks and across the blocks is no more than 7.

Both the 9B/10B code and the 7B/8B code contain three types of vectors: (i) zero disparity (balanced and disparity independent) vectors; (ii) vectors with a disparity of ±2; and (iii) vectors with a disparity of ±4. The balanced vectors can be entered with any of the four starting disparities, except in conjunction with the comma character described below. Vectors with a positive disparity can only be entered with a negative starting disparity and vectors with a negative disparity can only be entered with a positive starting disparity. Each 9B and 7B source vector is assigned either to a single balanced 10B and 8B vector, respectively, or to a pair of complementary non-zero disparity coded vectors.

That is, if the current running disparity is positive (+1 or +3), only a balanced or a negative disparity vector may be entered and complementary rules apply for a negative running disparity.

(A) 9B/10B Code

The 9B/10B code comprises 517 code points with 517 source vectors assigned to 802 coded vectors of which 232 are balanced, 190 have a disparity of plus two, 190 have a disparity of minus two, 95 have a disparity of plus four, and 95 have a disparity of minus four. The 9B/10B code, referred to as the 10B coded vector set or the 10B alphabet, is illustrated by the trellis diagrams of FIGS. 1A through 1C. Thus, the 10B alphabet includes enough vectors to encode 517 input variations of the 9-bit sub-block and a control line K. Of the 517 vectors, 512 may be assigned to any two bytes of normal data and 5 vectors are assigned to inputs other than normal data as signaled by a control line K, as will be explained below. More specifically, the encoded 10B set of vectors consists of the following subsets:

(i) 232 Balanced 10B Vectors. This subset, as shown in FIG. 1A, includes all possible balanced vectors with a starting and ending run length of no more than three. According to the invention, there are 232 such vectors. The vectors are both balanced and disparity independent. Disparity independence means that they can be entered in a sequence regardless of the current starting disparity (i.e., one of the four values: +3, +1, −1, or −3). Balanced means that the running disparities at the start and end of the vector are identical. The subset (232) of all possible 10B vectors (1024) chosen is the set of balanced vectors with a run length of no more than three at the leading or trailing boundaries.

Figure 1B:
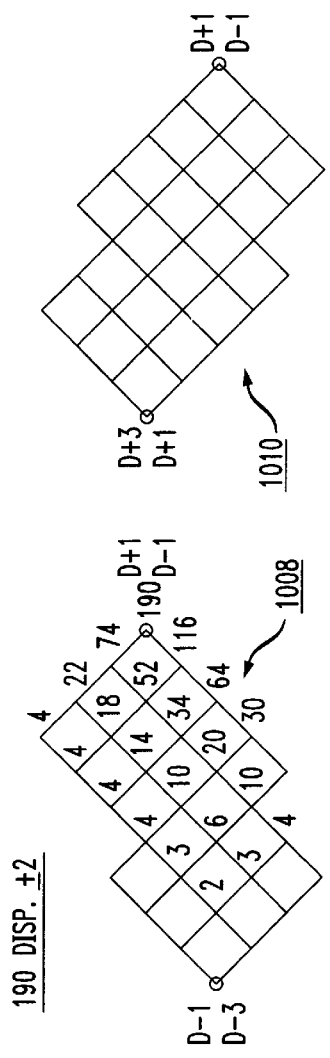

(ii) 2×190 10B Vectors with Disparity ±2. This subset, as shown in FIG. 1B, includes all possible vectors with a disparity of +2, a run length of no more than three at the front end, and no more than three zeroes or four ones at the trailing end. There are 190 such vectors according to the invention. An exact complementary set of 190 vectors has a disparity of −2.

Figure 1C:
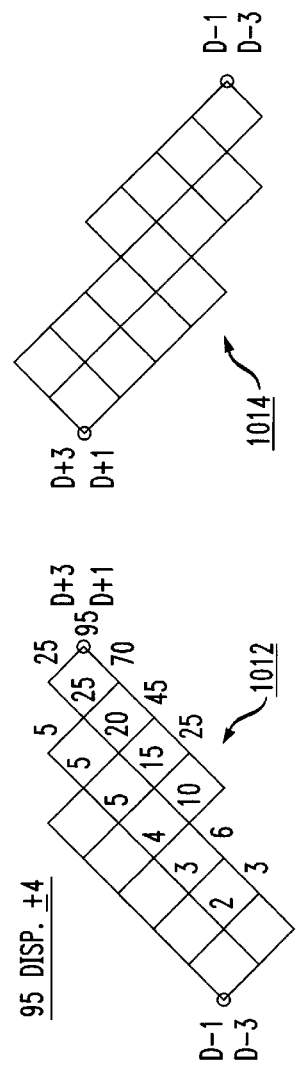

(iii) 2×95 10B Vectors with Disparity ±4. This subset, as shown in FIG. 1C, includes all possible vectors with a disparity of +4, no more than four ones or two zeroes at the front end, and no more than one zero or four ones at the trailing end. There are 95 such vectors according to the invention. An exact complementary set of 95 vectors has a disparity of −4.

The respective trellis diagrams in FIGS. 1A through 1C plot the running disparity (vertical axis) as a function of time or digit intervals for the various coded vectors. Thus, for the 10 B alphabet, the horizontal axis is divided into 10 digit intervals. Note that the horizontal axis shown in FIG. 1A is the same for FIGS. 1B and 1C. The relative position of each node (e.g., denoted as reference numeral 1000 in FIG. 1A) on the vertical axis represents the running disparity at the end of the bit sequence to the left. Each one bit is marked by a rising line segment (e.g., denoted as reference numeral

1002 in FIG. 1A) extending over one digit interval; conversely, a zero bit is represented by a falling line (e.g., denoted as reference numeral 1004 in FIG. 1A). Trellis diagrams are commonly used as state diagrams. For this particular application, another way of looking at the trellis diagram is as an output of a perfect integrator for transmitted square pulses. This perspective helps to understand the low frequency characteristics of the code. As a low pass filter, the integrator sorts out the low frequency components. Each valid bit sequence generates one of the possible traces through the diagrams. The numbers to the right of the nodes indicate the number of different paths from the starting node (e.g., denoted as reference numeral 1006 in FIG. 1A) to the location of that node. These numbers are easily generated from node to node, starting with the left side entry node (1006). In this way, the number of vectors meeting the established constraints can readily be obtained without mathematics and pattern searches.

In FIG. 1B, reference numeral 1008 denotes the 190 10B vector set with disparity +2 and reference numeral 1010 denotes its exact complementary set of 190 10B vectors with disparity –2. In FIG. 1C, reference numeral 1012 denotes the 95 10B vector set with disparity +4 and reference numeral 1014 denotes its exact complementary set of 95 10B vectors with disparity –4.

As mentioned, up to five of the 10B vectors can be reserved for information other than normal data. If any of the five control characters is to be encoded, a control line K, as will be explained, must be asserted together with an appropriate data field. A singular comma sequence is also available for quick synchronization. It extends over the 10B field and the first three bits of the 8B field. The bit pattern is '0011111110'1110xxxx' for a negative starting disparity, or its complement for a positive starting disparity '1100000001'0001yyyy'). In the above bit sequence, the ' symbol marks the boundary between the 10B vector and the 8B vector. The 8B vector (1110xxxx or 0001yyyy) is restricted to the patterns listed below in the 7B/8B code section. For synchronization, only the ten ones (or zeroes) in an 11-bit field need to be monitored, assuming a synchronization enabling circuit is activated only after a majority of misaligned commas has been received. Eleven bits are monitored in order to detect the boundary between the 10B vector and the 8B vector. The vector 0011111110 and its complement from the set of 10B vectors with disparity of four must be reserved for this purpose as a special non-data character. The construction of a complete comma character is described below in the next subsection.

The disparity levels (D±1, D±3, D–1, D–3, D+1, D+3) to the left center of the trellis diagrams of FIGS. 1A, 1B, and 1C represent the allowed entry disparities. For the vector sets of FIGS. 1B and 1C, vectors from the left-side or right-side diagrams must be chosen to match the current running disparity. To the right of the diagrams of FIGS. 1B and 1C, the respective complementary exit disparities are given. For the vectors of FIG. 1A, the exit running disparity matches the entry disparity.

(B) 7B/8B Code

The 7B/8B code comprises 128 code points with 128 source vectors assigned to 188 coded vectors of which 68 are balanced, 48 have a disparity of plus two, 48 have a disparity of minus two, 12 have a disparity of plus four, and 12 have a disparity of minus four. The 7B/8B code, referred to as the 8B coded vector set or the 8B alphabet, is illustrated by the trellis diagrams of FIGS. 2A through 2C. Thus, the 8B alphabet includes enough vectors to encode 128 input variations of the 7-bit sub-block. More specifically, the encoded 8B set of vectors consists of the following subsets:

(i) 68 Balanced 8B Vectors. This subset, as shown in FIG. 2A, includes all possible balanced vectors with a starting and ending run length of no more than three. According to the invention, there are 68 such vectors. The vectors are both balanced and disparity independent. The subset (68) of all possible 8B vectors (256) chosen is the set of balanced vectors with a run length of no more than three at the leading or trailing boundaries.

For the generation of the coma sequence only, a subset of four complementary pairs of balanced 8B vectors must be made disparity dependent. One or the other of the complements must be chosen depending on the polarity of the running disparity at the end of the 10B comma vector. The 8B bit patterns suitable for comma generation together with the required polarity in front of the 8B vector are listed below:

(1)  +11101000  –00010111

(2)  +11100100  –00011011

(3)  +11100010  –00011101

(4)  +11100001  –00011110

For implementation purposes, the running disparity in front of the 10B comma vector may be observed which is always complementary to the ending polarity.

(ii) 2×48 8B Vectors with Disparity ±2. This subset, as shown in FIG. 2B, includes all possible vectors with a disparity of +2, a run length of no more than three ones or two zeroes at the front end, and no more than two zeroes or three ones at the trailing end. There are 48 such vectors according to the invention. An exact complementary set of 48 vectors has a disparity of –2.

(iii) 2×12 8B Vectors with Disparity ±4. This subset, as shown in FIG. 2C, includes all possible vectors with a disparity of +4, no more than three ones or one zero at the front end, and no zeroes and no more than three ones at the trailing end. There are 12 such vectors according to the invention. An exact complementary set of 12 vectors has a disparity of –4.

Similar to FIGS. 1A through 1C, the respective trellis diagrams in FIGS. 2A through 2C plot the running disparity (vertical axis) as a function of time or digit intervals for the various coded vectors. Thus, for the 8B alphabet, the horizontal axis is divided into 8 digit intervals. Note that the horizontal axis shown in FIG. 2A is the same for FIGS. 2B and 2C. Again, the relative position of each node (e.g., denoted as reference numeral 2000 in FIG. 2A) on the vertical axis represents the running disparity at the end of the bit sequence to the left. Each one bit is marked by a rising line segment (e.g., denoted as reference numeral 2002 in FIG. 2A) extending over one digit interval; conversely, a zero bit is represented by a falling line (e.g., denoted as reference numeral 2004 in FIG. 2A). Again, each valid bit sequence generates one of the possible traces through the diagrams. The numbers to the right of the nodes indicate the number of different paths from the starting node (e.g., denoted as reference numeral 2006 in FIG. 2A) to the location of that node. These numbers are easily generated from node to node, starting with the left side entry node (2006). In this way, the number of vectors meeting the established constraints can readily be obtained without mathematics and pattern searches.

In FIG. 2B, reference numeral 2008 denotes the 48 8B vector set with disparity +2 and reference numeral 2010 denotes its exact complementary set of 48 8B vectors with disparity −2. In FIG. 2C, reference numeral 2012 denotes the 12 8B vector set with disparity +4 and reference numeral 2014 denotes its exact complementary set of 12 8B vectors with disparity −4.

Similar to FIGS. 1A through 1C, the disparity levels (D±1, D±3, D−1, D−3, D+1, D+3) to the left center of the trellis diagrams of FIGS. 2A, 2B, and 2C represent the allowed entry disparities. For the vector sets of FIGS. 2B and 2C, vectors from the left-side or right-side diagrams must be chosen to match the current running disparity. To the right of the diagrams of FIGS. 2B and 2C, the respective complementary exit disparities are given. For the vectors of FIG. 2A, the exit running disparity matches the entry disparity.

(C) Properties of the 16B/18B Code

Some important characteristics of the transmission code of the invention may be extracted from the trellis envelope diagram in FIG. 3. The vertical axis of the diagram in FIG. 3 represents disparity, while the horizontal axis represents 18B digit intervals. Reference numeral 3000 represents the upper portion of the envelope associated with the 16B/18B transmission code, while reference numeral 3002 represents the lower portion. Also, FIG. 3 illustrates four exemplary configurations 3004, 3006, 3008 and 3010 and the four respective complements 3012, 3014, 3016 and 3018 for a comma character sequence for use in the transmission code of the invention. The comma sequence according to the 16B/18B transmission code of the invention is singular, i.e., it cannot be reproduced in any other position relative to the vector boundaries neither within the 18B block nor 18B block boundaries. Verification that the comma sequence is singular may be accomplished using FIG. 3 with the trellis diagrams of FIGS. 1A through 1C and FIGS. 2A through 2C. It is to be appreciated that to acquire byte and word alignment in a data receiver, circuits must search for the comma pattern '1111111×111' or the complement, or both, depending on prevalent presence or absence of either of the complementary versions in the serial link framing architecture. The x in this pattern represents a do-not-care bit. The circuit search can be extended to '00111111101110' and the complement for greater reliability in the presence of errors, but for most applications, the added complexity can not be justified.

Accordingly, in one embodiment, the present invention provides for generating a singular comma sequence in response to a control input and a specific nine-bit source vector assigned to a ten-bit coded control vector with a disparity of plus or minus four combined with a restricted set of eight-bit code points with polarity control in which a true or complement form of a plurality of coded balanced eight-bit vectors is selected in response to a control input and a current running disparity. The singular comma may generate a run length of two followed by a run length of seven and ending with a run length of one in the ten-bit domain, followed by a run length of three in the 8B domain.

(i) Clocking and Synchronization Parameters. As is evident in FIG. 3, the maximum run length of the 16B/18B transmission code is seven, e.g., comma sequence 3004 illustrates a maximum RL of 7. Also, according to the code, no contiguous runs of seven are permitted. The minimum transition density is four per 18B block for an indefinite length. By minimum transition density, we mean that any of the allowed 10B and 8B coded vectors change from one to zero or vice versa at least twice each, as can be verified from the trellis diagrams of FIGS. 1A through 1C and FIGS. 2A through 2C.

(ii) Low Frequency Characteristics. The 16B/18B transmission code of the invention is balanced. The maximum digital sum variation is 12. The normalized dc offset is 4.83, i.e., 87 divided by 18. The low frequency cut-off point for high pass filters must be located about 2.5 times lower than for the Fibre Channel 8B/10B code (described in the above-referenced research report) for equal eye closure.

(iii) Control Characters. The transmission code of the invention may include four 18B words with the comma character. The 10B field may have four other control characters which can be combined with any vector from the 8B field for a total of 516 18B control words including synchronization words. To simplify implementation, less control characters may be specified.

(D) Implementation of Encoder and Decoder

Figure 4:
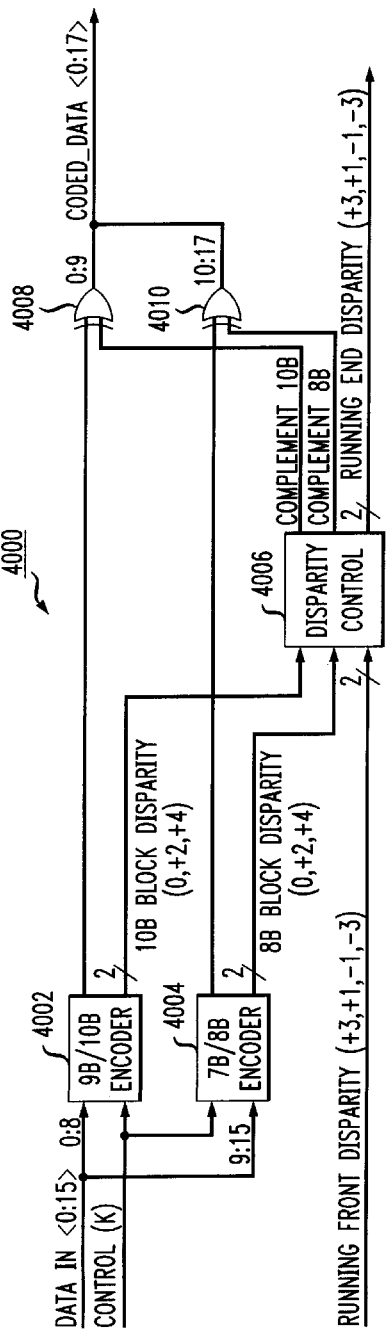
FIG. 4 is a block diagram illustrating an exemplary encoder for implementing a 16B/18B transmission code according to the invention.

Referring now to FIG. 4, a block diagram of an exemplary encoder 4000 for implementing a 16B/18B transmission code according to the invention is shown. It is to be appreciated that FIG. 4 illustrates an overall functional organization of an 16B/18B encoder of the present invention. Accordingly, FIG. 4 also represents in essence a data flow chart for the encoding system. The encoder 4000 includes a 9B/10B encoder 4002, a 7B/8B encoder 4004, a disparity control block 4006, and logic gates 4008 and 4010. It is to be understood that the element 4008 represents a set of ten exclusive OR gates and element 4010 represents a set of eight exclusive OR gates.

It is assumed that 16 bits of parallel data enter the encoder 4000. It is to be understood that the data could be provided on parallel lines from an originating system or could be the output of a serial-to-parallel converter which accumulates data in 16-bit blocks and transfers it to the encoder 4000 in parallel. Data bits are denoted in an x:y format. That is, Datain <0:15> denotes the 16-bit block (i.e., bit 0 through bit 15) input to the encoder 4000. Similarly, Coded_Data <0:17> denotes the 18-bit binary digit block (i.e., binary digit 0 through binary digit 17) output by the encoder 4000. The input block is partitioned such that the first 9 data bits 0:8 are gated into the 9B/10B encoder 4002 for the 9-bit sub-block and bits 9:15 are gated to 7B/8B encoder 4004 for the 7-bit sub-block. The 9B/10 B encoder encodes the 9 data bits 0:8 into 10 binary digits 0:9, while the 7B/8B encoder encodes the 7 data bits 9:15 into 8 binary digits 10:17. The 9B/10B and 7B/8B encoders operate to a large extent independently of each other. A control line K is input to the sub-block encoders 4002 and 4004 to indicate whether the input data lines represent data or control information such as frame delimiters and a limited set of other special characters.

It is to be appreciated that the logical functions that the blocks in FIG. 4 perform are in accordance with the respective 9B/10 B code and 7B/8B code defined and explained above in the context of the trellis diagrams of FIGS. 1A through 1C and FIGS. 2A through 2C. The particular assignment of coded vectors to source vectors according to the inventive 16B/18B transmission code may be implemented in various forms of hardware, software and/or combinations thereof. For example, the encoder 4000 of the invention may be implemented using one or more of the following approaches: (i) specific logic which implements the assignment and classifications between source vectors and coded vectors; (ii) logic synthesis; (iii) table look-up techniques, for example, using two separate tables for a subset of the 8B and 10B vectors, wherein the subsets may include those translations which are not readily classified and implemented with parity circuits in combination with simple combinational logic. Further, the encoder 4000 may be implemented on a general purpose computer, including at least one processor and associated memory, suitably programmed to implement the encoding methodology associated with the 16B/18B transmission code of the invention, as described herein. However, other implementation approaches may be employed. The implementation depends on a suitable choice of assignments between the uncoded input (source) vectors and the set of coded vectors. By way of example, a parity bit may be appended to the uncoded bits and then the number of bits to be changed for singular assignments between source vectors and coded vectors is minimized.

The following is an example of how the encoder 4000 in accordance with the trellis diagrams of FIGS. 1A through 1C and FIGS. 2A through 2C encodes an input 16B block into 18 binary digits for transmission.

As a 9B/10B encoding example, combinational logic of the 9B/10B encoder may determine that the 9-bit input matches one of the 116 patterns which leads to the upper node '116' of FIG. 1A and then simply append a zero to generate a balanced coded vector. If the circuitry senses a data pattern leading to the lower node '116', a one bit is appended. In both cases, a balanced vector is generated which may be indicated with a value of '00' on the two lines labeled "10B Block Disparity" in FIG. 4. Since balanced vectors are disparity independent, the "Complement 10B" line is not asserted and the "Running End Disparity" equals the "Running Front Disparity." For some of the vectors of FIGS. 1B and 1C, a similar technique is successful, to obtain a coded vector, but for others, such as an all zeroes or all ones input, we first flip some of the bits and then apply similar techniques. An alternative is to revert to table look up techniques for this less tractable subset of all input vectors.

For disparity dependent code blocks, the Disparity Control unit 4006 determines whether the required polarity of the input disparity (plus or minus) matches the polarity of the current "Running Front Disparity" and asserts the "Complement 10B" line on a mismatch. The "Complement 10B" line is gated with the set of ten exclusive OR gates to provide the appropriate ten binary digits 0:9 for the input vector. The Disparity Control unit 4006 also calculates the new "Running End Disparity" based on the "Running Front Disparity" and the disparity of the coded block after complementation, if any.

The encoding of 8B vectors is exactly analogous to the above explanation for 10B vectors. FIG. 4 assumes that the 10B and 8B encoders generate only balanced or positive disparity vectors which simplifies the Disparity Control circuit and is a preferred mode if the encoders use table look up techniques. However, if mostly combinational logic is used for encoding, it may be advantageous to generate both positive and negative disparities in the encoding process to simplify encoding at the cost of a more complex Disparity Control circuit. In such case, three lines rather than just two are needed to indicate the Block Disparities.

Figure 5:
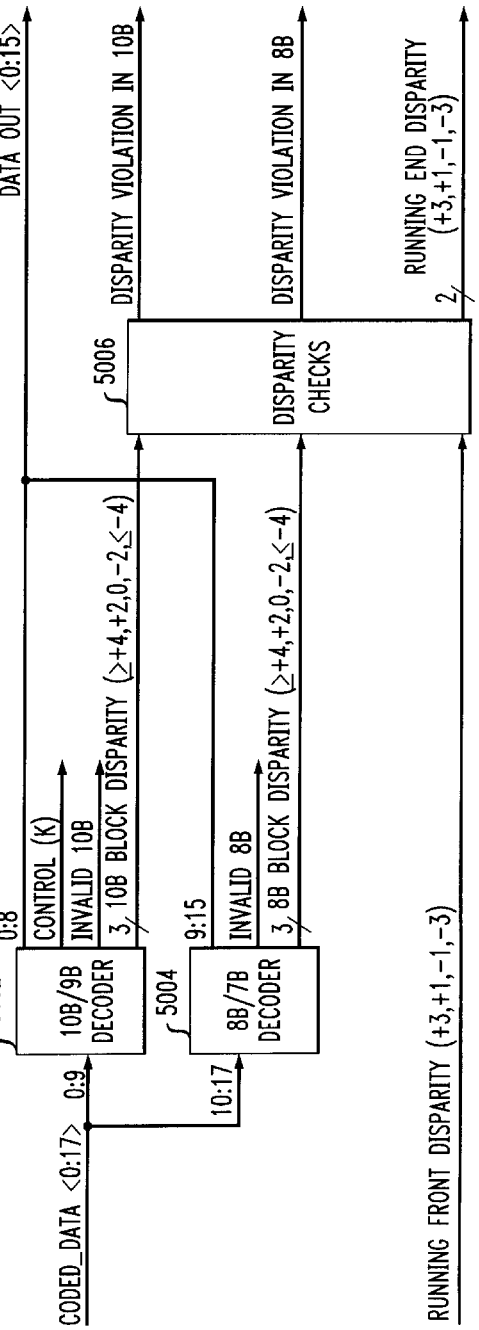
FIG. 5 is a block diagram illustrating an exemplary decoder for implementing a 16B/18B transmission code according to the invention.

Referring now to FIG. 5, a block diagram of an exemplary decoder 5000 for implementing a 16B/18B transmission code according to the invention is shown. It is to be appreciated that FIG. 5 illustrates an overall functional organization of an 18B/16B decoder of the present invention. Accordingly, FIG. 5 also represents in essence a data flow chart for the decoding system. The decoder 5000 includes a 10B/9B decoder 5002, an 8B/7B decoder 5004, and a disparity checks unit 5006. The decoder circuit includes code violation and disparity error checks. In the presence of errors, the received blocks may have a disparity of 6, 8 or 10, which may be lumped together with the disparity of 4 for the purposes of the running disparity (+4, −4). It is to be understood that an 18B/16B decoder according to the invention may be implemented in accordance with one or more of the approaches mentioned above for the 16B/18B encoder. However, other implementation approaches may be employed.

The decoding circuits of FIG. 5 generally perform the reverse function of encoding. As an example, if any balanced vector encoded according to the encoding example given with respect to FIG. 4 is received, it can be sensed by combinatorial logic and the appended bit with a value of either zero or one is simply dropped to revert to the uncoded data set and the Running disparity remains unchanged. For some unbalanced inputs, it is necessary to flip back some of the bits, but the last bit is generally dropped since it is just used to identify the coded vector. Again, some of the more difficult translations may be performed by tables. Encoded vectors which are outside the defined alphabets (e.g., all ones) cause the "Invalid 10B" or "Invalid 8B" outputs to be asserted. The Disparity Check circuit 5006 updates the running disparity similar to the Disparity Control circuit 4006 in FIG. 4. For the purposes of these calculations, disparities with an absolute value of greater than four generated by errors are assumed to be four. The circuit 5006 also checks whether the required polarity for the entry disparity of a received vector matches the polarity of the current "Running Front Disparity." For example, if the 8B vector '01110111' is received with a current "Running Front Disparity" of either +1 or +3, we have a disparity violation. If a mismatch is detected for either a 10B or an 8B vector, the respective "Disparity Violation" line is asserted.

(E) Error Correction

As previously mentioned, the 16B/18B transmission coding system of the invention preferably implements an error correction methodology. In one embodiment, error correction according to the present invention is implemented in a manner that modifies aspects of the techniques disclosed in U.S. Pat. No. 5,740,186 ('186 patent) to Widmer, entitled "Apparatus and Method for Error Correction Based on Transmission Code Violations and Parity," the disclosure of which is incorporated herein by reference. The '186 patent discloses techniques for correcting errors in 8B/10B binary transmission coded data employed in accordance with the Fibre Channel Standard (FCS). Accordingly, a description of the '186 patent error correction technique is provided below followed by the inventive modifications to the techniques for use with the 16B/18B transmission code of the invention.

(i) FCS Error Correction in the '186 Patent. A method to correct a single erroneous byte in a frame is disclosed. The fundamental principle is using a rectangular arrangement of horizontal and vertical parity bits, where the horizontal parity locates the error and the vertical parity is used to correct it. The distinctive feature is that the functional equivalent of the horizontal parity is provided by a small set of parity bits derived from the byte disparities of the Fibre Channel Standard (FCS) transmission code combined with error detection by the code. The implementation of this error correction scheme can be made transparent to the existing FCS link level hardware and to the FCS transmission protocol. There is no reduction in throughput, but there is added delay equal to the length of a frame.

Figure 6:
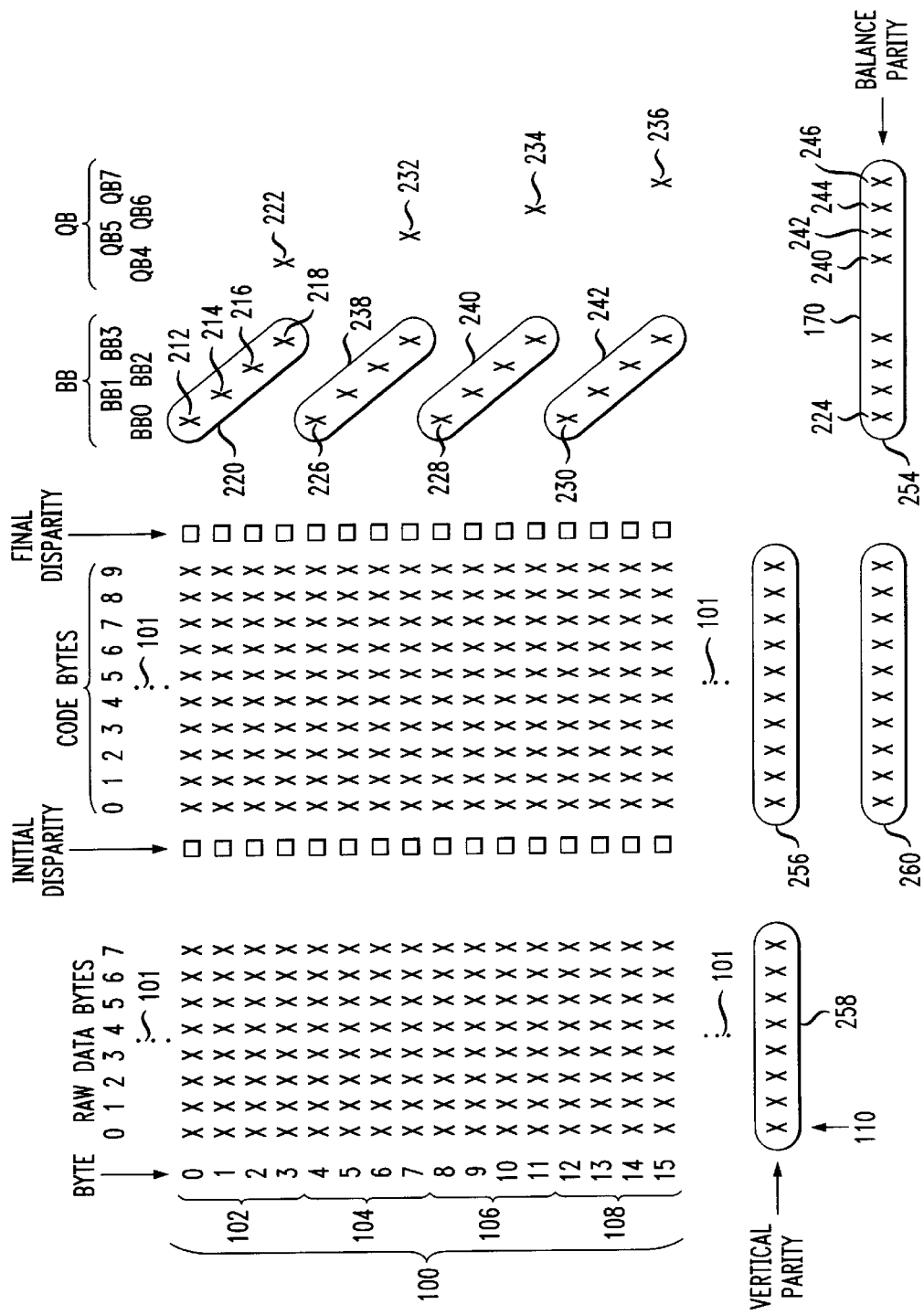
FIG. 6 is a diagram illustrating a horizontal and vertical parity technique used for 8B/10B coded data.

FIG. 6 shows the horizontal and vertical parity technique. FIG. 6 shows a frame 100 of raw data. Sixteen bytes are shown from frame 100 which can have any number of bytes which is indicated by the series of dots 101. The bytes of the example of raw data in FIG. 6 have 8 bits, however, a byte can have any number of bits. The raw data is segmented into bytes, 16 of the bytes are labeled from 0–15. Each byte has 8 bits labeled 0–7. The X's correspond to bits of data which typically have a 1 or 0 value. According to the technique, each raw data byte is transformed into a coded byte. A vertical parity 258 is determined for the raw data of the entire block 100. For example, bit location 0 of the raw data has a corresponding vertical parity bit 110. Vertical parity bit 110 has a value of 1 or 0 depending upon the total number of 1's or 0's in the 0 bit location over the entire frame of raw data. Each coded byte has an initial disparity and a final disparity. The changes in disparity over each byte of the code is constrained to certain values. The initial disparity for each coded byte is the same as the final disparity of the preceding coded byte. The permitted disparity variation over a coded byte is determined by the selection of the coding. For this error correction technique, a code is described and the permitted disparity variation over each coded byte. Each coded byte has a balance bit BB. Bytes B0, B1, B2, and B3 have balance 212, 214, 216 and 218, respectively. If there are an equal number of 1's and 0's in a coded byte, the balance bit BB is 1, and if there are an unequal number of 1's and 0's in a coded byte, the balance BB is 0. Another balance corresponds to each word. For example, balance bits BB 212, 214, 216 and 218 together form a balance 220 corresponding to word 102. As shown in FIG. 6, each one of the words 102, 104, 106 and 108 has a word balance 220, 238, 240 and 242, respectively, associated therewith. Each one of the word balances, for example, balance 220 has a balance bit QB. The QB bits corresponding to balance byte 220, 238, 240 and 242 are 222, 232, 334 and 236, respectively. A balance vertical parity is determined from the two groups of balance bits BB and QB. The 0 bit location of the balance parity 254 is the parity of the BB0 bits, that is, parity 224 is the parity of bits 212, 226, 228, 230, . . . Correspondingly, balance parity bits 248, 250 and 252 are the parities of the BB bits in bit location BB1, BB2, and BB3, respectively. The balance bits QB 222, 232, 234 and 236 are the balances, respectively, of word 220, 238, 240 and 242. Bit 240 corresponding to bit location QB4 is the parity of all the bits which are in the bit location QB4. Correspondingly, balance parity bits 242, 244 and 246 are the parities of the balance bits in bit location QB5, QB6 and QB7, respectively. The balance parity 254 which is an 8-bit word is coded as a 10-bit byte 260. Vertical parity 258 which is an 8-bit byte is coded to a 10-bit byte 256. The machine (encoder) which is transmitting the data transmits frame 100 including the coded vertical parity byte 256 and the coded balance parity byte 260. The receiving machine (decoder) receives the coded bytes corresponding to frame 100 and generates a recomputed vertical parity corresponding to vertical parity 258 and generates a recomputed balance parity corresponding to balance parity 254. The receiving computer first looks at the coded bytes to determine if any of the bytes are an invalid arrangement of 1's and 0's. For the coded data, only certain arrangements of 1's and 0's are valid coded bytes. Others are not part of the code and, therefore, are invalid. If an invalid coded byte is found, it is known that an error is contained within that byte. If an invalid coded byte is found, it is corrected by looking at the recomputed vertical parity as compared to the transmitted vertical parity to identify which bit locations in the coded byte are in error. The value of the coded bits which are in error is then changed from a 1 to a 0 or vice versa.

If there are no code violations, the disparity of each coded byte is checked to determine if there is a disparity violation. The variation in the disparity from the initial disparity to the final disparity of each valid coded byte is constrained within the code to be within a certain range, for example, the change in disparity over a valid coded byte could be limited to zero and plus or minus 2 as is the case for the FCS code.

Also, for a code to limit the digital sum variation to be between a maximum and minimum value, the polarity of coded bytes with non-zero disparity must alternate to avoid a disparity violation. If there are no disparity violations in the disparities of each of the coded bytes within the transmitted frame, no errors are detected and nothing is done.

If there is an invalid character, it is corrected by the vertical parity. An invalid character can be followed by at most one disparity violation in the disparities of each of the coded bytes. If there are more than one disparity violations following the invalid byte, more than one byte has an error and it cannot be corrected. Therefore, the receiving machine requests that the transmitting machine retransmit the frame of data. If there are no invalid bytes and a disparity violation is observed, the above described horizontal and vertical parity scheme to identify the location of the error is used.

For the Fibre Channel Standard (FCS) transmission code, it has been calculated that statistically an error is with high probability within 16 bytes preceding the identified disparity violation for the case of random data. The probability that the error is more than 16 bytes preceding the disparity violation is about $2 \times 10^{-9}$. As described above, the balance parities identify the location of the byte having the error and the vertical parity identifies the location of the particular bits having errors. The procedure described above using a vertical parity and a new balance parity is used with codes which do not contain local parity. Therefore, the procedure described above supplements codes which do not have local parity.

An alternative solution as referred to above is to use a code which has local parity. In a code with local parity, each 8-bit byte has unique coded 10-bit bytes which correspond thereto. The coded bytes are designed such that if there is an error in any one of the bit locations, the valid coded byte would be converted into an invalid coded byte.

Detailed Example

When using FCS transmission code violations for error locating, Balance Bits BB and QB are defined for each coded byte and 4-byte word, respectively, with a value of one for balanced blocks and zero otherwise. Sets of 4 BB and 4 QB bits are each arranged diagonally in separate quadruplets for successive groups of 4 bytes and 4 words, respectively. A parity bit is derived for each of the diagonal bit positions of all the BB and the QB sets of a frame. Only these 8 parity bits BPAR (refers to balance parity 254) are transmitted after the end of the frame. For random data, the FCS code by itself locates all single byte errors to a range of 16 bytes except one error in $5 \times 10^8$ errors. Violations in the received BPAR bits are used to trace an error more precisely to a specific byte of the 16 byte group identified by the code. A set VPAR (refers to vertical parity 258) of 8 vertical parity bits derived from the uncoded data, and the 8 BPAR bits are coded and packed into the first Idle word following the End of Frame. After identification of a faulty byte at the receiver, the VPAR bits are used to correct it.

Initially, the elementary rectangular error correction scheme using parity bits is described. Then the use of horizontal parity to locate an error will be described. A technique is presented which locates an erroneous byte in a frame by the FCS transmission code combined with 8 parity bits transmitted after the end of the frame. Then, the correction of an erroneous byte by vertical parity bits is described as well as the restoration of faulty control characters. A detailed description is given on how to correctly identify the start and the end of a frame in the presence of an error. Finally a description is given on how to correct errors in FCS frames using the principles described here in a way which is transparent to existing link level hardware and FCS protocols. The conclusions evaluate the suitability of the this error locating techniques for applications with predominantly very short or long frames.

Elementary Correction Scheme

The basic correction scheme proposed according to the present invention is based on conventional ordering of data and parity bits in a rectangular or matrix arrangement. A frame is partitioned into small segments, preferably bytes or words. A parity or other means of error detection is attached to each of the segments, and together they form a matrix line. Successive segments are placed on the following lines. This first set of parity bits is called the horizontal parity.

Several of these segments are followed by a vertical parity set. The vertical parity consists of a parity bit for each data bit column. It is used to identify and correct the erroneous bit or bits in the segment which was tagged as erroneous by the horizontal parity.

An entire faulty line can be corrected. For this reason, the vertical parity is computed on the uncoded bits, since error spread from decoding contained to a segment or byte does not interfere with correction. The vertical parity has enough bits to cover at least one segment. To correct longer error bursts, two or more vertical parity lines may be appended; by way of example, a first parity can be calculated from all the even numbered lines, and a second one from all the odd numbered lines. It is then possible to correct error bursts extending over a pair of adjacent lines, or two isolated shorter bursts, if one of them occurs in an even and the other in an odd numbered line. The vertical parity lines are coded like data. If an error occurs in a vertical parity byte, it is ignored and not used for correction of possible other errors.

A necessary assumption is that, apart from short error bursts, the link error events occur randomly at a low enough rate so most of the time there is just a single error event within a frame. If this assumption does not hold, the frame length must be reduced, or a vertical parity must be inserted into the frame at fixed intervals. Another assumption is that most errors are confined to a single matrix line. The systems and methods described can be adapted to handle errors crossing line boundaries at the cost of increased complexity. It is a further requirement to have correct recognition of the start and the end of the frame in the presence of errors. A cyclic redundancy check computed over the frame ultimately determines the validity of the corrected or uncorrected frame. Retransmission facilities are preferably still available for the case where error correction fails: failure of the horizontal parity to detect certain multiple errors, an error burst longer than the vertical parity, lost byte synchronization, multiple error bursts, false start and end of frame detection, truncated or missing frames, etc.

Horizontal Parity

In the commonly used parity matrix, the horizontal parity is an explicit bit for each matrix line. In the example below, the horizontal parity is instead supplied by the combination of a transmission code and a few parity bits at the end of the frame, computed on features of the code which are guaranteed to change for an odd number of errors. Transmission codes are subject to several constraints to enhance reliable low cost transmission. Additional constraints can be built into a code, so any odd number of errors in a byte or word generates an invalid word. Such a property of the code is referred to as "local parity." For general applications, such codes are less desirable, because the added constraint makes it necessary to degrade some transmission parameters, and to accept a more complex and higher cost implementation. Other 8B/10B codes, including the FCS Standard code, most times also indicate immediately an invalid byte when an error has occurred. However, a substantial ratio of errors generates only a disparity violation farther down the bit stream, away from the byte where the error occurred, and so the byte which contains the error(s) cannot directly be identified.

Horizontal Parity with Fibre Channel Standard Transmission Code

On average, two out of three single bit errors on a FCS link generate an invalid character or a disparity violation at the location where the error has occurred. Another disparity violation further along the bit stream may also show up. However, an error may sometimes produce simply another valid character without violating the disparity rules up to that point. Nevertheless, a disparity violation will then appear no later than in the End of Frame delimiter, depending on the transmitted data pattern.

It may be shown that for random data preferably a single error in a coded byte of the FCS 8B/10B transmission code makes it invalid with a probability of 0.65. The probability of an error being missed in the byte where it occurs, or the next three bytes, is 0.008; the chance for it to remain undetected by the end of the first 8 or 16 bytes is $5\times10^{-5}$ and $2\times10^{-9}$, respectively. Extending the search over 16 bytes makes sufficient allowance for the fact that the data patterns may not fit the random model. For other, non-partitioned 8B/10B codes, over 40 bytes are needed to get comparable statistics.

If we are satisfied to correct all but about one in 100 errors, a brute force approach might be appropriate. On the first occurrence of a code violation, the assumption would be that the error was in that or one of the 3 preceding bytes. Correction would be accomplished by a 4 byte vertical parity. A large set of vertical parity bits with some modified locating rules also would be beneficial for links afflicted with a significant number of burst errors. However, to make the expense and adverse impacts of FEC (forward error correction) worthwhile, the correction rate must be better than 99% for most applications. The error location can be determined more precisely by supplemental procedures as follows.

To locate the erroneous byte, a virtual bit, the balance bit BB, is attributed to each coded byte. A BB bit has a value of one for balanced vectors, and zero otherwise. The BB bit is not transmitted, it is just used to compute a set of parity bits as described below. If binary byte numbers are assigned as address to all bytes of a frame in ascending order, then BB0 is the balance bit of any byte with a low order binary address 00; BB1, BB2, and BB3 cover the binary byte address 01, 10, and 11, respectively. In other words, if the block structure is made up of 4 byte words, as happens for FCS, then BB0 is the balance bit of the first byte of a word, and BB3 of the last byte of the word. An odd parity bit PB0 is computed for the set of all BB0 bits. PB1, PB2, and PB3 provide odd parity for the sets of BB1, BB2, and BB3 bits, respectively. The parity bits PBx are appended to the end of the frame. An error in the transmission channel will change the value of a balance bit BBx with a low order binary byte address x, which in turn will produce a parity violation for the respective PBx parity bit at the end of the frame as BPAR. The error also generates a code violation at a location y. The location y of the code violation may be identical to the error location x, or y may be located a few bytes after x. The full address y of the violation is recorded. The assumption is then made that the error location is the byte with low order address x at location y or the next preceding address with x in the low order position.

Lets say an error occurred in a byte with the binary address 0_1110 and did not generate a code violation at that point, but only a disparity violation 3 bytes later at address 1_0001. In the receiver, the address 1_0001 is recorded. At the end of the frame, PB2 will be in violation and thus indicates that the error occurred in a byte with low order binary address 10. The assumption is that the error was in the set of 4 bytes ending with the transmission code violation at address 1_0001. Reducing this address in steps by one until the two low order bits match 10 results in the address 0_1110, the actual location of the error.

A locating range of just 4 bytes is generally not enough, but the range can be extended at will by the addition of more PBx bits. However, this is not the most efficient and lowest cost approach. An extension of the range to 16 bytes can be accomplished by the addition of just 4 more parity bits. A second level of balance bits BQ0, BQ1, BQ2, and BQ3 is attributed to consecutive 4 byte words with low order address 00xx, 01xx, 10xx, and 11xx, respectively. BQy is a one for every coded word with an equal number of ones and zeros. The value of BQy can be derived most efficiently as the even parity of BB0, BB1, BB2, and BB3 of word y. Again, a set of 4 odd parity bits PQ0, PQ1, PQ2, and PQ3 is derived from the set of all BQ0, BQ1, BQ2, and BQ4 balance bits, respectively, and then appended to the end of the frame. On the occurrence of a code violation, the assumption is made that the error occurred in one of the series of 16 bytes ending with the code violation.

An error will cause a transmission code violation which points to a set of 16 consecutive bytes likely to contain the error. A parity violation in a PQy bit identifies the specific erroneous word from the set of 4 words flagged by the code, and a violation in a PBx bit points to a particular byte in that word. The function of the PQy and PBx quadruplets is solely to enhance the error locating capabilities of the FC transmission code, not to correct the error.

Vertical Parity for Error Correction

An odd parity bit is derived for each column of the coded or uncoded matrix, and transmitted in coded form after the end of the frame. For easy implementation, it is preferred to derive the parity from the uncoded data, because of better compatibility with common data formats, buffer width, and the processing stream. Typically, one byte of vertical parity bits will be generated, but a larger or smaller segmentation is possible. At the receiving end, the FCS decoder may enlarge a single bit error to a burst of 5 or 3 in the decoded domain, depending on whether the error occurred in the first 6 or last 4 bits of a coded byte, respectively. The matrix correction scheme is not adversely affected by this error spread.

The decoder should be built so it can distinguish between inherently invalid bytes, and simple disparity violations, which may be caused by an error in a preceding byte. For the correction of inherently invalid bytes, the procedure described in the preceding paragraph for locating the erroneous byte can be bypassed. A single disparity violation following an invalid byte is ignored. If more than one disparity violations follow, no correction should be attempted. After the end of a frame has been received, each bit of the invalid byte in a column with a vertical parity violation is complemented. If more than one byte in a frame is invalid, no correction attempt is made.

If the first violation is a disparity violation rather than an outright invalid byte, the location of the faulty byte must first be determined with the help of the parity violations of the balance bits PQy and PBx. Then correction is done as above. Correction is suspended, if the disparity violation is followed by an invalid byte or by more than one other disparity violation, which all indicate multiple errors in different bytes.

An error located in the parity bytes is normally ignored. Assume that frames are protected by a powerful cyclic redundancy check as well, which will detect false corrections and errors not detectable by the transmission code.

Burst Errors

If a link is afflicted with a significant number of burst errors spread over less than 10 coded bits, one would want to be able to correct errors which straddle byte boundaries. Modified error locating rules would be required to produce a best assumption about the location of the error burst start and end. For the partitioned FCS code, the resolution of the error location can be enhanced by the addition of extra balance bits BB and the related 2 BPAR bits for the first 6 bits and the last 4 bits of the coded byte. If it is determined that an error burst extends over the last 4 bits of a byte and the first 6 bits of the next byte, the trailing 3 vertical parity bits are then used to correct the trailing 3 bits of the first byte, and the leading 5 vertical parity bits correct the first 5 bits of the next byte.

Recovery of Special Characters

The case of special characters which are afflicted with errors deserves extra scrutiny. For applications which use a variety of special characters in unpredictable configurations, an additional vertical parity bit is used for the K bit, which indicates whether a byte is data or control information. For the Fiber Channel application this bit would be useful only to correct errors in the K28.5 character of the Start and End of Frame delimiter which is done by other means described below.

Fibre Channel Start and End of Frame Detection

It is very important to correctly recognize the Start of Frame (SOF) and the End (EOF), otherwise the parity correction scheme does not work. At the transmitter, this is no problem, because of the absence of errors. Our goal below is to recognize the frame boundaries at the receiver correctly, unless there are at least two bytes with errors. It is unfortunate, that the SOF and EOF ordered sets defined by FCS are not optimized for this endeavor; replacing K28.5 by K28.7 in EOF, and perhaps also in SOF, would help. Also, the Huffman distance between the other 3 bytes of the Idle and SOF could be increased. However, we assume below FCS formats to maintain compatibility, except that the first Idle word following EOF is replaced by a parity word PP at the transmitter. It is restored to Idle at the receiver. For error correction to operate satisfactorily, it is a requirement that loss of word synchronism within a frame occurs several orders of magnitude less often than simple bit errors. The receiver must be operated in explicit word alignment mode to prevent loss of synchronism resulting from just one or a few errors.

Figure 7:
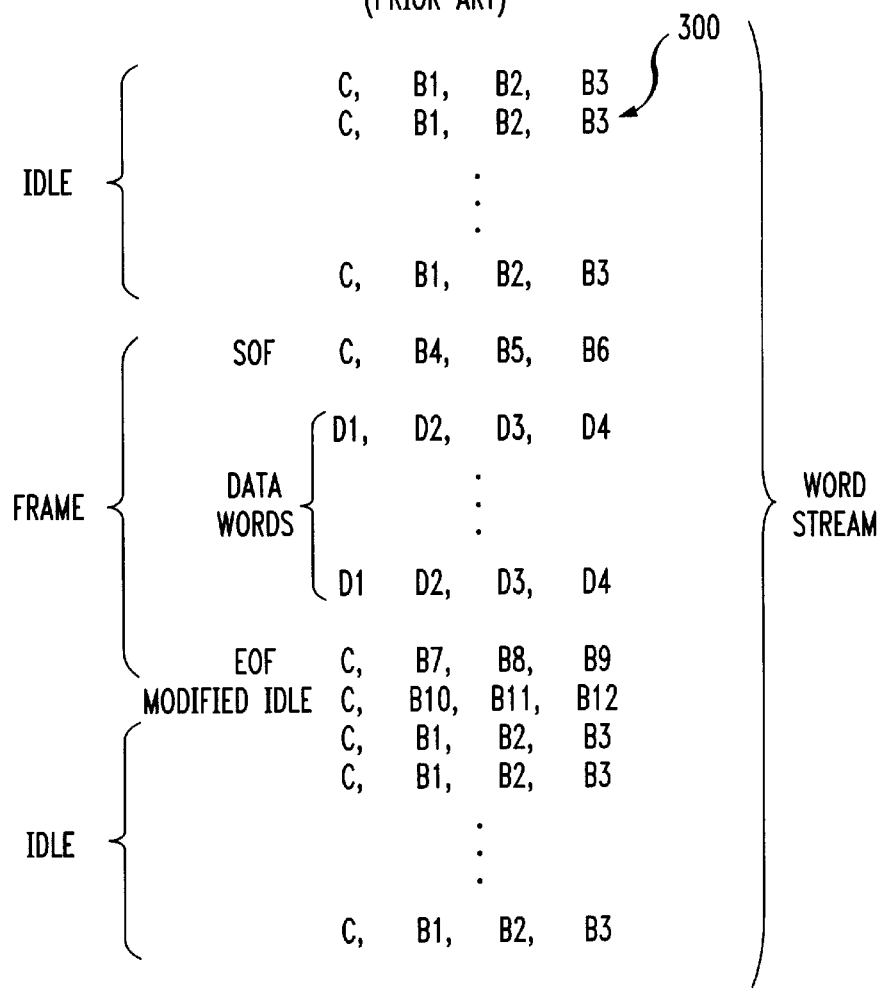
FIG. 7 is a diagram illustrating a technique for detecting a start and end-of-frame in a horizontal and vertical parity technique used for 8B/10B coded data.

FIG. 7 shows a method for detecting a start and end-of-frame. FIG. 7 shows a word stream wherein each word is composed of four bytes. Each of the idle words, the start-of-frame (SOF) words, the end-of-frame (EOF) words and the modified-idle word contain a comma as one of the four bytes; the comma is preferably the first byte of each of these words.

The idle word is "C, B1, B2, B3" wherein C is the comma, B1, B2, and B3 need not be the same byte but can be chosen from a set of greater than three characters (the idle-word subset). The SOF word is "C, B4, B5, B6" wherein C is the comma. B4, B5 and B6 need not be the same byte but can be chosen from a set greater than three characters (the SOF word subset). Usually several different SOF words are defined.

The EOF word is "C, B7, B8, B9" wherein C is the comma. B7, B8 and B9 need not be the same byte but can be chosen from a set greater than three characters (the EOF word subset). Usually several different EOF words are defined.

The modified-idle word is "C, B10, B11 and B12" wherein C is the comma. B10 and B11 are the parities VPAR and BPAR and B12 can be chosen from a set of greater than one character (the modified-idle subset).

The machine monitors the word stream to determine if the current word (for example word 300 in FIG. 7) is an idle word (i.e. in idle mode), an SOF word, a data word, an EOF word, or a modified idle word. The frame of words starts with the SOF word and ends with the EOF word. The modified-idle word comes after the EOF word.

If an error exists on a bit of an idle-word, a SOF word, an EOF word, or a modified-idle word, the start and end-of-frame can still be detected using the following method. In the idle state, the machine monitors the current word to determine if the current word is an idle word or a SOF word. If three of the four bytes of the current word do not match with three of the four bytes for a SOF word, it is determined the word stream has not left the idle mode. The byte which does not match has a bit error. If three of the four bytes of the current word match a SOF word, than the current word is an SOF word and the beginning of a frame. If the current word is not an idle or a SOF word, then the machine does not enter the frame state.

In the frame state, the machine monitors for the presence of a EOF word. Error free data words do not match with the SOF, EOF, idle and modified idle words because they have no comma character. The current word is determined to be an EOF word (and the end of frame) if either three of the four bytes of the current word match the bytes of an EOF word and at least two of the bytes of the next word match the corresponding bytes of the modified-idle word, or if the current word matches all four bytes of an EOF word and at least one byte of the next word matches a corresponding byte of the modified idle word.

Recognition of SOF

Special procedures to recognize the frame boundaries in the presence of a single erroneous byte must guard against starting a frame too soon because of an error in the Idle, or too late because of an error in SOF. We describe below SOF recognition in terms of the coded bits, because that gives more time to change the operating mode of the correction circuitry at the receiver. If the coded bytes are not accessible, the rules can be translated for the uncoded domain.

The correction circuitry is either in the Idle state or the Frame state. The transition from the Idle state to the Frame state must be made when SOF is received. The FCS Idle sequence is K28.5-D21.4-D21.5-D21.5. The SOF sequence is K28.5-D21.5-Dx.y-Dx.y, where x=21, 22, 23, or 24, y=0, 1, or 2. An examination of the coded bits reveals that a change from Idle to any of the versions of SOF entails a change from zero to one for the last bit (j) of the third and fourth byte, and for the seventh bit (f) of the second byte. The 10 bits of a coded byte are labeled in sequence with 'abcdeifghj' according to FCS notation. Starting from the Idle state, we can thus reliably recognize SOF, if any two of the above three bits change to one. To formally describe the conditions, the following notation is used: B0w, B1x, B2y, and B3z stand for the 4 bytes of a word; the letters wxyz identify a one bit in a particular bit position (abcdeifghj); the plus sign (+) and bullet (•) stand for the Boolean OR and AND function, respectively. The path from the idle state to the frame state is taken at the start of the word which meets the following condition:

$B1f \cdot B2j + B1f \cdot B3j + B2j \cdot B3j$

Recognition of EOF

Reliable recognition of EOF for certain data patterns and error locations is difficult. The probability of correct EOF determination can be improved by more checks extending over several words. In the following, the EOF checks rely on all or part of 6 bytes in the EOF and the PP word, which is created by the correction circuitry right after the EOF word. Note that for purposes of error correction, the frame ends with the PP word. The checks are based on the coded received data.

The EOF sequence has the following format: K28.5-Du.v-D21.w-D21.w, where u=21 or 10, v=4 or 5, and w=3, 4, 6, or 7. The disparity after the second and the last byte of this word is always negative. The last 3 bits 'ghj' of byte B1 are always '010.' The first 8 bits 'abcdeifg' of the last 2 bytes B2 and B3 are always '101010x1.'

The PP word starts and ends with negative disparity, and has the following format: K28.5-Dm.n-Dp.q-D3.v, where m, n, p, and q are not restricted, and v is 4 or 5 as required for negative ending disparity. The last byte B3 of the PP word in coded form is thus '110001x010.'

To describe the end of frame conditions in the presence of an error, the terms listed below are defined. The EOF word is assigned the subscript 0 and PP is identified by subscript 1.

$B0n_0$=0011111010 for EOF byte B0 with negative starting running disparity
$B0p_0$=1100000101 for EOF byte B0 with positive starting running disparity
$B0_1$=0011111010 for PP byte B0
$B1.21_0$=101010xxxx for EOF byte B1 bits
$B1.10_0$=010101xxxx for EOF byte B1 bits
$B1.4_0$=xxxxxx0010 for EOF byte B1 bits
$B1.5_0$=xxxxxx1010 for EOF byte B1 bits
$B2_0$=101010x1xx for EOF byte B2
$B3_0$=101010x1xx for EOF byte B3
$B3_1$=110001x010 for PP byte B3

An EOF is recognized in word position 0 for the conditions A through F below. All conditions include at least one control character.

Conditions A and B make allowance for errors in the first or last byte of PP.

$A = B0n_0 \cdot (B1.21_0 + B1.10_0) \cdot B1.4_0 \cdot B2_0 \cdot B3_0 \cdot (B0_1 + B3_1)$
$B = B0p_0 \cdot (B1.21_0 + B1.10_0) \cdot B1.5_0 \cdot B2_0 \cdot B3_0 \cdot (B0_1 + B3_1)$ Conditions C and D make allowance for errors in one of the last two bytes of EOF.

$C = B0n_0 \cdot (B1.21_0 + B1.10_0) \cdot B1.4_0 \cdot (B2_0 + B3_0) \cdot B0_1 \cdot B3_1$
$D = B0p_0 \cdot (B1.21_0 + B1.10_0) \cdot B1.5_0 \cdot (B2_0 + B3_0) \cdot B0_1 \cdot B3_1$ Condition E makes allowance for errors in the second byte B1 of EOF.

$E = (B0n_0 + B0p_0) \cdot B2_0 \cdot B3_0 \cdot B0_1 \cdot B3_1$

Condition F makes allowance for errors in the first byte B0 of EOF.

$F = (B1.21_{0+B1.10_0}) \cdot (B1.4_0 + B1.5_0) \cdot B2_0 \cdot B3_0 \cdot B0_1 \cdot B3_1$ With the above conditions, a single erroneous byte will not obliterate the recognition of EOF, and it is also unlikely that it generates an early, false EOF. The following observations can be made.

If errors generate a spurious control character K28.5 in position B0 of a word other than the one before EOF, at least 31 coded data bits must match a prescribed pattern to meet conditions A, B or F above. The conditions C, D, or E cannot be met with any data pattern.

If errors generate a spurious control character K28.5 in position B0 of the word before EOF, at least 24 coded data bits must match a prescribed pattern to meet conditions A, B, or F above. The other conditions cannot be met with any data pattern.

Return to Idle State

The SOF and EOF recognition circuits return to the Idle state after recognition of EOF. Errors in multiple bytes could prevent recognition of EOF. To avoid a hung-up condition and to force a return to the Idle state before the start of the next frame, the Idle state is forced if a first word starts with '0011111010' and is followed by another word, which matches the Idle word bit for bit: '0011111010.1010100010.1010101010.1010101010.' The requirement for 2 consecutive control words prevents a premature return to the Idle state because of a single faulty byte within a frame.

An Example of Error Correction with Fibre Channel Code
Structure of Error Correction Circuits The error correction scheme described above lends itself to various implementations. One could exploit it to correct short error bursts crossing byte boundaries. This requires more complex rules. The example below addresses errors confined to a single byte. It is assumed that the error correction is an appendix to existing architectures, and an attempt is made to minimize hardware modifications of existing macros to accommodate error correction.

Transmitter Port

At the transmitter end, the vertical parity bits VPAR are derived from the uncoded data starting with the first byte of SOF and ending with the last byte of EOF. The balance bits BB are a by-product of the coder, they can be derived from the block disparities of the 6B and 4B vectors, or by monitoring the changes in the running disparity from byte to byte. For either method, only 4 to 6 additional gates are required to determine the BB value for each byte. The parity bits BPAR are derived from the BB bits. Both VPAR and BPAR are coded and substitute the second and third byte of the first Idle word following EOF. The fourth byte of this Idle is changed to D4.5 or D4.4, as required for ending the word with negative disparity, using the same controls (K, M) and circuits as for the second byte of EOF. For this last byte, the input of the coder is always presented with D4.4, K=0, and M=1. The coder will then automatically change D4.4 to D4.5, if required to obtain a negative ending disparity, as described in the next paragraph.

Special Fibre Channel Requirements: FCS defines Ordered Sets which are used as Frame Delimiters, Primitive Signals, and Primitive Sequences. All these sequences start with the special character K28.5 and are followed by 3 data characters. The standard requires that many of the Ordered Sets start with a negative disparity. To force a negative starting disparity, the attached communications adaptor must assert a control line M together with the control line K. Similarly, the End of Frame Delimiter must always end with negative disparity, which is accomplished by manipulation of the 4 B part of the second byte of the ending delimiter, which is a data byte. The data point Dx.4 is used in this position to go from positive to negative disparity, and Dx.5 is used to maintain the existing negative disparity. To get the desired result, the adapter will always present Dx.4 in this position and assert the M line, but not the K line. The coding circuitry will then force bit F to one if the running disparity at the start of the byte is −1. This procedure converts Dx.4 to Dx.5 to produce always a negative ending disparity.

Intermediate Nodes

In a system, error correction may be done strictly on a per link basis, i.e. between a single transmitter and receiver, or end to end, which may include several links and switches. In the first case, this proposal can be made invisible to the higher levels of the architecture. The transmitter simply modifies the last 3 bytes of the first Idle after EOF. At the receiver, the error correction circuitry connects to the de-serializer and the decoder. It corrects the frames before passing them on to the next level, and it restores the first Idle word. For this approach it does not matter how the switch handles the Idles.

If error correction is done end to end, intermediate nodes such as switches must not disturb the word following EOF. One must make sure that switches pass the PP word along unchanged. Idle word additions or deletions must occur after the PP word has passed.

Receiver Port

At the receiver end, there are more options to evaluate. On might want to use the existing data buffer. When a parity error is detected and located, that particular byte in the buffer is corrected. But then the CRC for that frame has to be recomputed to assure validity. This interferes with normal data flow and control operations, and it cannot easily be merged into existing complex chip structures. However, it has the functional advantage, that there is no extra delay, if there are no errors.

For now, a more practical and easy approach is to store the received frame in a dedicated buffer between the decoder and the next level of hardware. After a complete frame has been received and after the erroneous byte, if any, has been located, the data transfer to the next level starts, and the faulty byte is corrected on the fly. There may be an extra line or other means to indicate that the received data has been modified for better monitoring of link performance. The Idle following EOF is restored to a normal Idle, so the error correction can be totally transparent to the higher levels of the protocol.

Alternatively, with more complex controls, it is possible to transmit a received frame directly to the higher level to avoid delays in the absence of errors. An erroneous frame would then immediately be followed by the corrected frame in the case of an error. The buffer then switches to first-in first-out mode, until it catches up with the data flow by eliminating extra Idles. Apart from complexity, this also requires the upper level protocol to be aware of this mode of operation.

For the buffer size, the following factors are to be considered: (i) the frame size must be constrained, so more than one erroneous byte in a frame is unlikely; (ii) the added latency from diverting the data through the buffer should be evaluated for the specific application, before selecting frame and buffer size; and (iii) cost may be a consideration.

(ii) Error Correction with the 16B/18B Code.

As mentioned above, error correction for implementation in the 16B/18B coding system of the invention may be based on the error correction techniques described above. The most important distinction is a different definition of the balance bits BB and QB as follows:

1. The BB bit is a one, if the respective coded 10B or 8B vectors have a disparity of zero or ±4. The BB bit is zero for a disparity of ±2. With this modified definition, any single error in a 10B or 8B vector will either change the respective balance bit or generate an invalid vector. The change in definition is necessary, because the present code includes vectors with a disparity of ±4 in addition to balanced vectors and vectors with a disparity of ±2. With the old definition (FCS error correction above), a change in unbalanced vectors does not always generate a change in the BB balance bit or an invalid vector.

2. The QP bits as are illustrated in Table 1 of FIG. 9 are the even (or odd) parity of a quartet of BB bits. The HP bits in turn are the parity of a quartet of QP bits.

Figure 8:
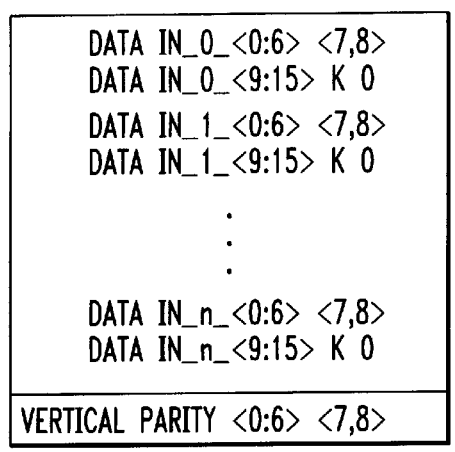
FIG. 8 is a diagram illustrating vertical parity used in a transmission code error correction method according to the invention.

Error correction in accordance with the 16B/18B transmission code may also implement the following additional changes over the FCS technique described above:

1. To keep the number of required parity bits from growing to a prohibitive amount, a nine-bit vertical parity is computed on the first nine data bits of the 16-bit uncoded input alternated with the last seven bits plus the K-bit and a dummy bit. The dummy bits in the sequence of bytes can be assigned any fixed pattern but preferably are assigned a constant value of zero or one. This vertical parity array is illustrated in FIG. 8.

2. Because with the 16B/18B code, a single error in a random data will on average take longer to generate a disparity error, the field of the presumed error location must be extended which leads to an increase of the number of BPAR bits. As an example, the fist level might contain four balance bits BB for two 10B and two 8B vectors. The second level of four parity bits QP checks on the disparity variations in four of the first level blocks similar to the definitions of the FCS technique described above. To increase the range, we simply add a third level of four parity bits HP (H for hexadecimal) which will increase the reach to 64 bytes.

With the suggested implementation above, we require a total of 21 parity bits (9+12) which must be transmitted at the end of an error check segment. These are the nine vertical parity bits at the bottom of FIG. 8 and the twelve parity bits h at the bottom of Table 1 of FIG. 9. The h bits (h for horizontal) are the parity bits computed from the BB, the QP, and the HP bits in a diagonal array similar to the one shown in FIG. 6 and FIG. 9.

Example of an Error Located to a Particular Byte

Referring to Table 1 of FIG. 9, assume that the last coded bit of byte 8B_0 in the second row is changed by an error from 1 to 0. The block disparity BD is thus changed from +4 to +2 and the respective BB bit changes from 0 to 1. As a consequence, the next QP bit on the fourth line changes from 1 to 0 and the next HP bit on line 16 (8B_7) changes from zero to one.

The running disparity RD changes from +3 to +1 on line 3, from +1 to −1 on line 4. The decoder will detect a disparity violation for byte 8B_1 on the fourth line which should have the complementary value. The address of this byte with a disparity violation is recorded and at the end of the error correction segment, a check is done on the h bits. It will be found that the second h-bit in the BB field, the first h-bit in the QP field, and the first h-bit in the HP field will be in error. This points correctly to byte 8B_0 as the erroneous byte using the FCS methods described in detail above. Depending on the relationships between coded and uncoded vectors, the error in the second byte may generate one or more errors in the decoded erroneous byte. The false bits will be identified by violations in the respective vertical parity bits of FIG. 8 and are then complemented for correction.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A method of producing a dc balanced run length limited rate 16B/18B code from an input data stream which includes one or more sixteen-bit source vectors, the method comprising the steps of:

partitioning the sixteen-bit input source vector into two vectors including nine and seven contiguous bits, respectively;

determining disparities associated with the partitioned vectors such that a first coded vector having ten binary digits is assigned to the nine-bit vector based on the determined disparity in accordance with a ten binary digit vector set, and a second coded vector having eight binary digits is assigned to the seven-bit vector based on the determined disparity in accordance with an eight-binary digit vector set; and combining the first and second coded vectors to form an eighteen-binary digit coded vector for transmission.

2. The method of claim 1, wherein the ten-binary digit vector set comprises a plurality of balanced coded vectors with a starting and ending run length of no more than three.

3. The method of claim 2, wherein the plurality of balanced coded vectors includes two hundred and thirty two coded vectors.

4. The method of claim 1, wherein the ten-binary digit vector set comprises a plurality of coded vectors with a disparity of plus two, a run length of no more than three at a front end, and no more than three zeroes or four ones at a trailing end.

5. The method of claim 4, wherein the plurality of coded vectors includes one hundred and ninety coded vectors.

6. The method of claim 4, wherein the plurality of coded vectors includes a set of vectors with a disparity of minus two which is complementary to the set of coded vectors with a disparity of plus two.

7. The method of claim 1, wherein the ten-binary digit vector set comprises a plurality of coded vectors with a disparity of plus four, a run length of no more than four ones or two zeroes at a front end, and no more than one zero or four ones at a trailing end.

8. The method of claim 7, wherein the plurality of coded vectors includes ninety five coded vectors.

9. The method of claim 7, wherein the plurality of coded vectors includes a set of vectors with a disparity of minus four which is complementary to the set of coded vectors with a disparity of plus four.

10. The method of claim 1, wherein the ten-binary digit vector set comprises five hundred and seventeen code points with five hundred and seventeen source vectors assigned to eight hundred and two coded vectors of which two hundred and thirty two are balanced, one hundred and ninety have a disparity of plus two, one hundred and ninety have a disparity of minus two, ninety five have a disparity of plus four, and ninety five have a disparity of minus four.

11. The method of claim 1, wherein the ten-binary digit vector set comprises one or more coded vectors reserved for information other than data.

12. The method of claim 11, wherein at least one of the reserved vectors represents a control character.

13. The method of claim 11, wherein at least one of the reserved vectors represents a leading portion of a comma sequence.

14. The method of claim 11, further comprising the step of selecting control code points with a dedicated control line K in a combination of a selected set of nine-bit source vectors.

15. The method of claim 1, wherein the eight-binary digit vector set comprises a plurality of balanced coded vectors with a starting and ending run length of no more than three.

16. The method of claim 15, wherein the plurality of balanced coded vectors includes sixty eight coded vectors.

17. The method of claim 1, wherein the eight-binary digit vector set comprises a plurality of coded vectors with a disparity of plus two, a run length of no more than three ones or two zeroes at a front end, and no more than two zeroes or three ones at a trailing end.

18. The method of claim 17, wherein the plurality of coded vectors includes forty eight coded vectors.

19. The method of claim 17, wherein the plurality of coded vectors includes a set of vectors with a disparity of minus two which is complementary to the set of coded vectors with a disparity of plus two.

20. The method of claim 1, wherein the eight-binary digit vector set comprises a plurality of coded vectors with a disparity of plus four, a run length of no more than three ones or one zero at a front end, and no zeroes and no more than three ones at a trailing end.

21. The method of claim 20, wherein the plurality of coded vectors includes twelve coded vectors.

22. The method of claim 20, wherein the plurality of coded vectors includes a set of vectors with a disparity of minus four which is complementary to the set of coded vectors with a disparity of plus four.

23. The method of claim 1, wherein the eight-binary digit vector set comprises one hundred and twenty eight code points with one hundred and twenty eight source vectors assigned to one hundred and eighty eight coded vectors of which sixty eight are balanced, forty eight have a disparity of plus two, forty eight have a disparity of minus two, twelve have a disparity of plus four, and twelve have a disparity of minus four.

24. The method of claim 1, further comprising the step of selecting a true or complement form of a plurality of coded balanced eight-bit vectors in response to a control input and a current running disparity.

25. The method of claim 24, wherein selected balanced eight-bit vectors represent a trailing portion of a comma sequence.

26. The method of claim 1, further comprising the step of generating an error correction message for transmission.

27. The method of claim 26, wherein the error correction message includes a plurality of vertical parity bits and a plurality of horizontal parity bits associated with a plurality of eighteen-binary digit coded vectors.

28. The method of claim 27, wherein the plurality of vertical parity bits are computed on the nine-bit partitioned vectors alternated with the seven-bit partitioned vectors plus respective control bits and dummy bits.

29. The method of claim 27, wherein the plurality of horizontal parity bits are computed by:
   computing a balance bit for each of the first and second coded vectors of the plurality of eighteen-binary digit coded vectors;
   computing a first parity bit from the balance bits associated with each two consecutive sets of first and second coded vectors of the plurality of eighteen-binary digit coded vectors;
   computing a second parity bit from the first parity bits associated with each eight consecutive sets of first and second coded vectors of the plurality of eighteen-binary digit coded vectors; and
   combining the balance bits and first and second parity bits to form the plurality of horizontal parity bits.

30. The method of claim 29, wherein a balance bit has a value of one when the respective first or second coded vector has a disparity of zero or a disparity of plus or minus four.

31. The method of claim 1, wherein the dc balanced run length limited rate 16B/18B code has a maximum run length of seven associated therewith.

32. The method of claim 1, wherein the dc balanced run length limited rate 16B/18B code has a maximum digital sum variation of twelve associated therewith.

33. The method of claim 1, wherein the dc balanced run length limited rate 16B/18B code has a normalized dc offset of 4.83 associated therewith.

34. The method of claim 1, further comprising the step of generating a singular comma sequence in response to a control input and a specific nine-bit source vector assigned to a ten-bit coded control vector with a disparity of plus or minus four combined with a restricted set of eight-bit code points with polarity control in which a true or complement form of a plurality of coded balanced eight-bit vectors is selected in response to a control input and a current running disparity.

35. The method of claim 34, further comprising the step of generating a run length of two followed by a run length of seven and ending with a run length of one in the ten-bit domain.

36. The method of claim 35, further comprising the step of generating a leading run length of three in the eight-bit domain with a polarity matching the polarity of the run length of seven in the ten-bit domain, followed by a run length of one or more, such that a coded sequence '00111111101110xxxx' is generated with a negative starting disparity, and a coded sequence '11000000010001yyyy' is generated with a positive starting disparity.

37. The method of claim 36, wherein the xxxx sequence contains three '0' values and one '1'.

38. The method of claim 36, wherein the yyyy sequence contains three '0' values and one '1'.

39. A method for generating a succession of coded vectors, the method comprising the steps of:
   accessing a ten-binary digit vector set comprising five hundred and seventeen code points with five hundred and seventeen source vectors assigned to eight hundred and two coded vectors of which two hundred and thirty two are balanced, one hundred and ninety have a disparity of plus two, one hundred and ninety have a disparity of minus two, ninety five have a disparity of plus four, and ninety five have a disparity of minus four;
   accessing an eight-binary digit vector set comprising one hundred and twenty eight code points with one hundred and twenty eight source vectors assigned to one hundred and eighty eight coded vectors of which sixty eight are balanced, forty eight have a disparity of plus two, forty eight have a disparity of minus two, twelve have a disparity of plus four, and twelve have a disparity of minus four; and
   forming the coded vector succession by alternating selected coded vectors from the ten-binary digit vector set and the eight-binary digit vector set with starting and ending disparities limited to values of plus or minus one and plus or minus three.

40. The method of claim 39, further comprising the step of limiting a running disparity in the succession of coded vectors by tracking the running disparity at boundaries between the alternating coded vectors based on the succession of coded vectors with a disparity of zero, plus two, minus two, plus four, or minus four.

41. The method of claim 40, further comprising the step of selecting non-zero disparity vectors of a polarity opposite the polarity of the current running disparity.

42. The method of claim 41, further comprising the step of indicating disparity violations in coded data if the vector sequences do not follow the encoding rules in the preceding steps.

43. The method of claim 39, further comprising the step of indicating illegal coded vectors which do not belong to the set of eight hundred and two coded vectors or the set of one hundred and eighty eight coded vectors.

44. Apparatus for producing a dc balanced run length limited rate 16B/18B code from an input data stream which includes one or more sixteen-bit source vectors, the apparatus comprising:

an encoder operative to partition the sixteen-bit source vector into two vectors including nine and seven contiguous bits, respectively, and to determine disparities associated with the partitioned vectors such that a first coded vector having ten binary digits is assigned to the nine-bit vector based on the determined disparity in accordance with a ten-binary digit vector set, and a second coded vector having eight binary digits is assigned to the seven-bit vector based on the determined disparity in accordance with an eight-binary digit vector set, and to combine the first and second coded vectors to form an eighteen-binary digit coded vector for transmission.

45. The apparatus claim 44, wherein the ten-binary digit vector set comprises five hundred and seventeen code points with five hundred and seventeen source vectors assigned to eight hundred and two coded vectors of which two hundred and thirty two are balanced, one hundred and ninety have a disparity of plus two, one hundred and ninety have a disparity of minus two, ninety five have a disparity of plus four, and ninety five have a disparity of minus four.

46. The apparatus of claim 44, wherein the eight-binary digit vector set comprises one hundred and twenty eight code points with one hundred and twenty eight source vectors assigned to one hundred and eighty eight coded vectors of which sixty eight are balanced, forty eight have a disparity of plus two, forty eight have a disparity of minus two, twelve have a disparity of plus four, and twelve have a disparity of minus four.

47. The apparatus of claim 44, wherein the encoder is further operative to generate a singular comma sequence in response to a control input and a specific nine-bit source vector assigned to a ten-bit coded control vector with a disparity of plus or minus four combined with a restricted set of eight-bit code points with polarity control in which a true or complement form of a plurality of coded balanced eight-bit vectors is selected in response to a control input and a current running disparity.

48. The apparatus of claim 44, wherein the encoder is further operative to generate an error correction message for transmission.

49. The apparatus of claim 48, wherein the error correction message includes a plurality of vertical parity bits and a plurality of horizontal parity bits associated with a plurality of eighteen-binary digit coded vectors.

50. The apparatus of claim 49, wherein the plurality of vertical parity bits are computed on the nine-bit partitioned vectors alternated with the seven-bit partitioned vectors plus respective control bits and dummy bits.

51. The apparatus of claim 49, wherein the plurality of horizontal parity bits are computed by: (i) computing a balance bit for each of the first and second coded vectors of the plurality of eighteen-binary digit coded vectors, (ii) computing a first parity bit from the balance bits associated with each two consecutive sets of first and second coded vectors of the plurality of eighteen-binary digit coded vectors, (iii) computing a second parity bit from the first parity bits associated with each eight consecutive sets of first and second coded vectors of the plurality of eighteen-binary digit coded vectors, and (iv) combining the balance bits and first and second parity bits to form the plurality of horizontal parity bits.

52. The apparatus of claim 51, wherein a balance bit has a value of one when the respective first or second coded vector has a disparity of zero or a disparity of plus or minus four.

53. Apparatus for decoding a dc balanced run length limited rate 16B/18B code generated from an input data stream which includes one or more sixteen-bit source vectors, the apparatus comprising:

a decoder operative to partition the eighteen-binary digit coded vector into two vectors including ten and eight contiguous binary digits, respectively, and to determine disparities associated with the partitioned vectors such that a first decoded vector having nine bits is identified based on the determined disparity in accordance with a ten-binary digit vector set, and a second decoded vector having seven bits is identified based on the determined disparity in accordance with an eight-binary digit vector set, and to combine the first and second decoded vectors to form a sixteen-bit decoded vector.

* * * * *